United States Patent [19]
Hori

[11] Patent Number: 6,153,930
[45] Date of Patent: Nov. 28, 2000

[54] ELECTRONIC CIRCUIT DEVICE AND METHOD

[75] Inventor: Yoshitsugu Hori, Shiga-ken, Japan

[73] Assignee: Murata Manufacturing Co., Ltd., Nagaokakyo, Japan

[21] Appl. No.: 09/233,448

[22] Filed: Jan. 20, 1999

[30] Foreign Application Priority Data

Jan. 20, 1998 [JP] Japan ................................. 10-23854

[51] Int. Cl.[7] ........................... H01L 23/24; H01L 23/04; H01L 29/40; H01L 23/29
[52] U.S. Cl. ........................ 257/687; 257/698; 257/730; 257/774; 257/788
[58] Field of Search ................................. 257/687, 690, 257/698, 700, 730, 774, 781, 780, 787, 788

[56] References Cited

U.S. PATENT DOCUMENTS 5,641,996  6/1997  Omoya et al. ........................ 257/787
5,737,191  4/1998  Horinchi et al. ....................... 361/764

*Primary Examiner*—Ngân V. Ngô
*Attorney, Agent, or Firm*—Burns, Doane, Swecker & Mathis, LLP

[57] ABSTRACT

An electronic circuit device is provided which can avoid unnecessary spreading of a sealing resin and on which components can be mounted at a high mounting density. An enclosure for preventing the resin from flowing outside its intended boundaries and having a larger size than a chip in a chip mounting area of a circuit board is formed. The chip is mounted in a face-down orientation in the chip mounting area enclosed by the enclosure. A sealing resin is cast through a gate for casting a resin and introduced into the gap between the chip and the circuit board. It can be judged whether the charging of the resin has been completed or not, by checking the flowing of the resin into the groove.

19 Claims, 4 Drawing Sheets

ELECTRONIC CIRCUIT DEVICE AND METHOD

This application corresponds to Japanese Patent Application No. 10-23854, filed on Jan. 20, 1998, which is hereby incorporated by reference in its entirety.

BACKGROUND OF THE INVENTION

1. Field of the Invention

The present invention relates to an electric circuit device having a chip mounted in a face-down orientation on a circuit board. Here, the term "chip" refers to any electrical component, such as, but not limited to, components having rectangular casings.

2. Description of the Related Art

FIG. 1 illustrates a related method employed when a chip 2 is mounted on a circuit board 1, such as a printed circuit board or the like. The circuit board is formed using an epoxy resin or the like as a base material. A hybrid integrated circuit can be formed on the circuit board using the so-called "solder bump" technique. More particularly, a chip 2 is mounted in a face-down orientation by bonding the solder bumps 4 of the chip 2 to an electrode 3 formed on the circuit board 1. The electrode 3 of the circuit board 1 is coated with a solder resist film 5 so that the solder resist film 5 prevents a solder from wetting and unnecessarily spreading on the electrode 3 when the solder is applied. After the solder bumps 4 are bonded as described above, the board is cleaned by removing the flux. A sealing resin 6 is discharged to the chip 2 on one side end of the chip, or near one side or two sides of the chip by means of a dispenser 7 or the like. The solder then flows into the gap between the chip 2 and the circuit board 1 based on the capillary phenomena. Then, the resin is heat-cured or photo-cured for making a seal with the resin (see FIG. 2). In FIGS. 1 and 2, just the chip 2 is mounted on the circuit board 1 for ease of illustration. However, other surface mounted components such as chip capacitors, chip resistors, and the like can be mounted adjacent to the chip 2.

In the hybrid integrated circuit as described above, the resin 6 becomes a smooth fillet 6a due to its surface tension. The fillet 6a bulges outward from the chip 2. When the board 1 is heated, or the resin 6 having a low viscosity is used to enhance the flow of the resin 6, the surface tension of the resin 6 decreases. As a result, the fillet 6a can enlarge and spread out, or the resin 6 is formed into a pseudo-circular shape at the location where the resin was initially discharged from the dispenser. This is an undesirable shape for resin sealing. Further, in some cases, variations in the discharge quantity of the resin from the dispenser 7 cause the fillet to become enlarged. When the resin 6 is considerably spread outward from the chip 2, as described above, the resin 6 may cover the electrode surface on which a component is to be mounted. This causes problems because the electrical connection is impaired. Also, the danger of the resin spreading hinders producing a device having high mounting density.

SUMMARY OF THE INVENTION

Accordingly, it is one exemplary object of the present invention to solve the above-described problems and to provide an electronic circuit device in which the undesired spread of resin is prevented and on which components can be mounted at a high mounting density.

To achieve the above object, according to a first exemplary aspect of the present invention, there is provided an electronic circuit device having at least one chip mounted in a face-down orientation on a circuit board. An enclosure for preventing a resin from flowing outside the enclosure is provided. The enclosure is larger in spatial extent than the chip provided in a chip mounting area of the circuit board. That is, the perimeter of the enclosure is larger than the perimeter of the chip. The chip is mounted in a face-down orientation in the chip mounting area surrounded by the enclosure, and a sealing resin is introduced into the gap between the chip and the circuit board.

When the sealing resin flows into the space defined by the chip and the enclosure, the resin flows into the gap between the chip and the circuit board. During this process, the sealing resin is preventing from flowing outward from the chip beyond the boundaries of the enclosure. Therefore, even though a resin having a low viscosity may be used, or the discharging quantity of the resin is increased to some degree, the enclosure prevents the resin from spreading out in an undesired manner, so that the resin is prevented from covering an electrode of an adjacent electronic component. Thus, it becomes possible to mount components with a high density and to easily introduce the resin.

When the chip and the enclosure are close to each other, the resin tends to overflow onto the chip and the enclosure. According to a second aspect of the present invention, a resin-casting gate protruding outward from the enclosure is provided. The gate is connected to the enclosure, such that the resin is prevented from overflowing in a direction outward from the chip.

In a typical case, it takes about 10 to 15 seconds for the sealing resin to flow into the gap between the circuit board and the chip. As the size of the chip is increased, the flow time becomes longer. In order to confirm whether the flow of the resin is completed or not, it would be necessary to monitor the four peripheral sides of the chip. This makes it difficult to realize a more efficient process. Particularly, when the distance between the chip and the enclosure provided along the periphery of the chip is short, it is difficult to judge whether the introduction of the resin is completed or not. Thus, according to a third aspect of the present invention, preferably, a groove for checking resin-introduction is provided. When the resin flows into of the groove, the resin introduction should be stopped. In one embodiment, the groove is provided at the farthest position from the gate. In other words, the flow of the resin is slowest at the position opposite to the gate (e.g., at the farthest position from the gate). Accordingly, when the resin flows into of the groove, it shows that the introduction of the resin has been completed. Thus, it can be easily judged whether the charging of the resin is completed or not.

According to a fourth aspect of the present invention, the enclosure is formed with a solder resist film. That is, when the present invention is applied to a hybrid integrated circuit, a surface mounted component is solder-bonded to the circuit board, adjacent to the chip. It is desirable to coat the solder resist film on the periphery of the area where the surface mounted component is solder-bonded so that the solder is prevented from spreading into an undesired or unnecessary place. By utilizing the solder resist film as the enclosure for preventing a resin from flowing out of the enclosure, the process for forming a separate enclosure can be omitted.

It is desirable to provide a predetermined clearance between the enclosure and the chip, so as to form the enclosure with a high dimensional accuracy. In case the enclosure is formed with an ordinary thermosetting resin by a printing method, dimensional variations of about ±0.1 to 0.2 mm are generated. When the enclosure is formed with a photosensitive resin material by photolithography according to a fifth aspect of the present invention, the dimensional variation can be reduced to be within ±0.05 mm. Thus, the dimensional accuracy of the enclosure can be enhanced.

When a metallic material such as Au or the like is used for the bumps, the height of the bumps is about 20 to 50 $\mu$m. The bumps are bonded to the circuit board by a technique such as thermocompression bonding or the like. In the process, the bumps are crushed under pressure, resulting in the formation of a gap with a height of about 10 to 30 $\mu$m between the chip and the circuit board. The sealing resin is cast into this gap. The distance between the side of the chip and the wall of the enclosure is narrow, for example, about 200 to 300 $\mu$m. Accordingly, if the top of the enclosure is disposed above the top of the chip, the resin is distributed in an unsatisfactory manner, causing a problem that the resin will flow along the top of the chip and the enclosure. For this reason, according to a sixth aspect of the present invention, preferably, the top of the enclosure is lower than the top of the chip.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENT

Figure 1:
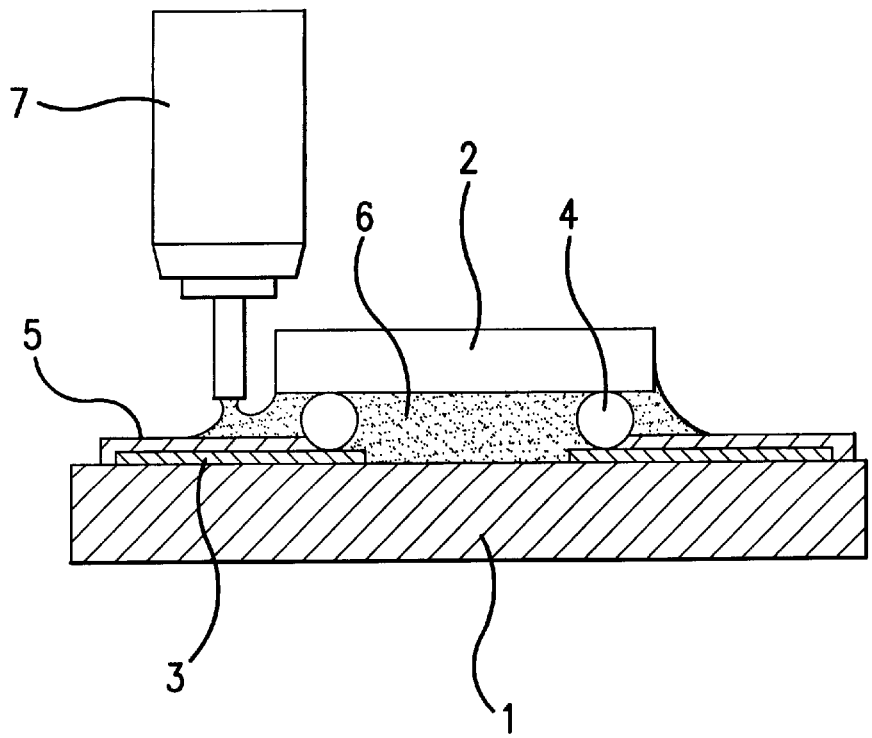
FIG. 1 is a sectional view of a conventional electronic circuit device illustrating the introduction of resin.
Figure 2:
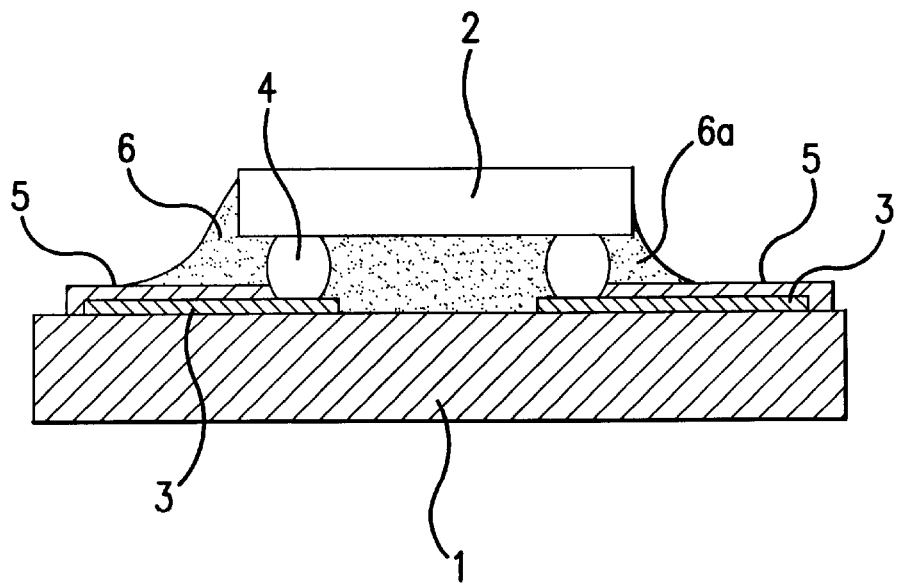
FIG. 2 is a sectional view of the electronic circuit device of FIG. 1 illustrating the device after the resin is introduced.
Figure 3:
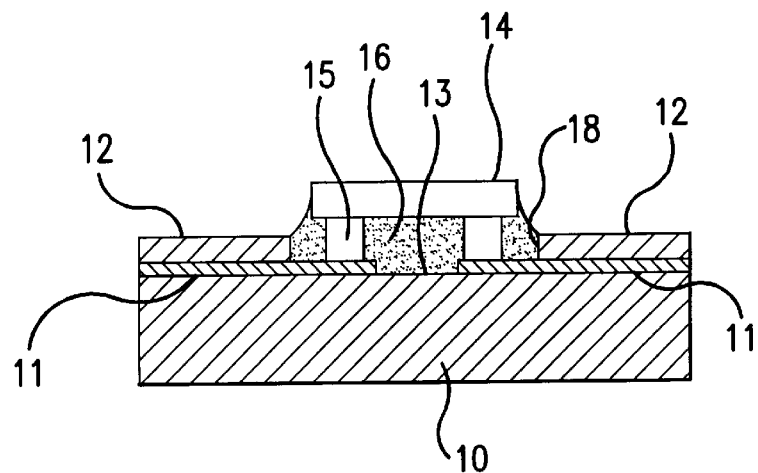
FIG. 3 is a sectional view of an electronic circuit device according to an exemplary embodiment of the present invention.
Figure 4:
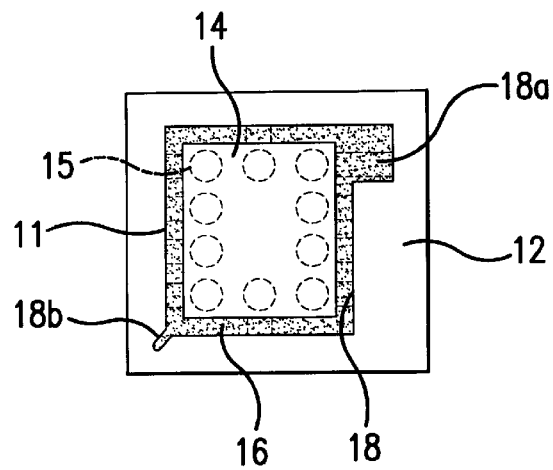
FIG. 4 is a plan view of the electronic circuit device of FIG. 3.
Figure 5:
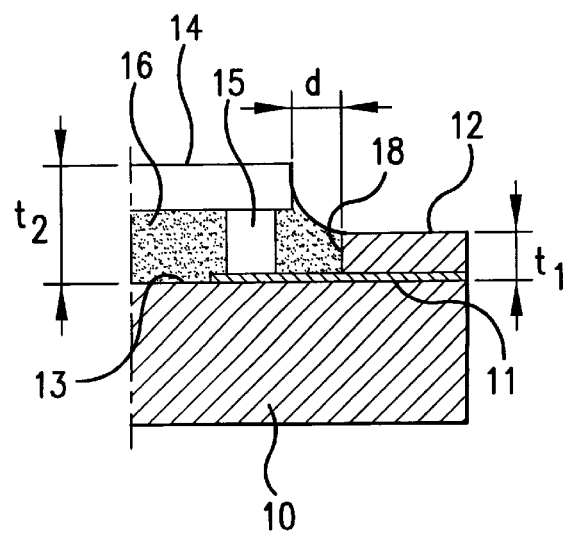
FIG. 5 is a partially enlarged view of the electronic circuit device of FIG. 3.

FIGS. 3 through 5 show an electronic circuit device according to an exemplary embodiment of the present invention. In these figures, an exemplary singular chip is shown, although plural chips can be mounted on the substrate, as well as other types of components.

In these figures, an electrode 11 is formed in a pattern on the top of a printed circuit board 10. The upper side of the electrode 11 is coated with a solder resist film 12, with the exception of chip mounting area 13, which is bare(e.g., does not include the solder resist film). Thermosetting type melamine resins and epoxy resins, UV curable epoxy resins and polyimide resins, and the like can be used as the material for the solder resist film 12. In the chip mounting area 13, a part of the electrode 11 is exposed. In the exposure area of the electrode 11, a chip 14 is mounted in a face-down orientation. More particularly, plural metallic bumps 15 are provided on the bottom of the chip 14. The metallic bumps 15 are bonded to the exposure area of the electrode 11 by thermocompression bonding, ultrasonic bonding, a solid phase diffusion bonding method using both heat and supersonic waves, bonding with an electroconductive paste, solder bonding, or other bonding technique. Materials such as Au, Cu, Pb—Sn, and the like can be used for the metallic bumps 15.

The inner wall of the solder resist film 12 surrounding the chip mounting area 13 constitutes an enclosure 18. Resin is prevented from flowing out from the enclosure 18. The enclosure 18 is so formed as to have a larger size (e.g., a larger perimeter) than the chip 14. As shown in FIG. 5, a gap d between the side face of the chip 14 and the inner face of the enclosure 18 is set to be in the range of about 200 to 300 $\mu$m. The solder resist film 12 is formed thin enough that the upper side of the solder resist film 12 is disposed beneath the bottom of the chip 14. More specifically, the thickness $t_1$ of the solder resist film 12 and the distance $t_2$ between the top of the chip 14 and the upper side of the circuit board 10 is set to be:

$t_1 < t_2$

In the present embodiment, for example, the thicknesses $t_1$, $t_2$ are set to be in the range of 10~50 $\mu$m, 200~400 $\mu$m, respectively.

Figure 6A:
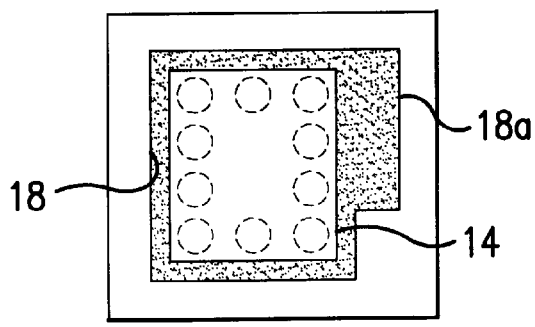
FIGS. 6A through 6F are plan views of modified examples of a gate for casting a resin.
Figure 6B:
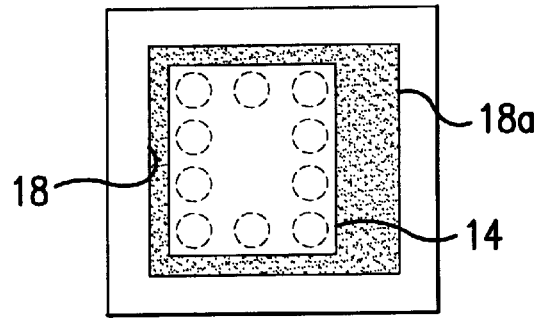
Figure 6C:
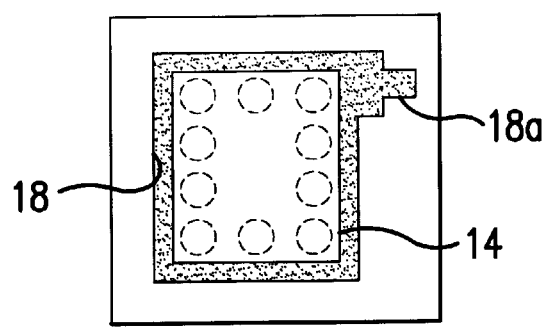
Figure 6D:
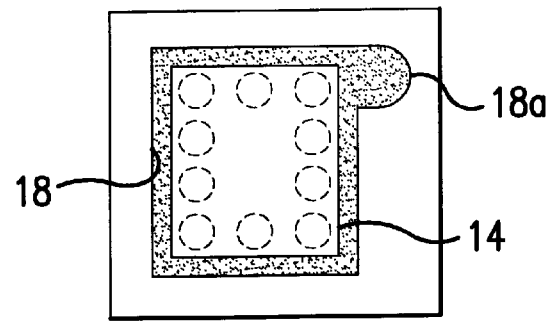
Figure 6E:
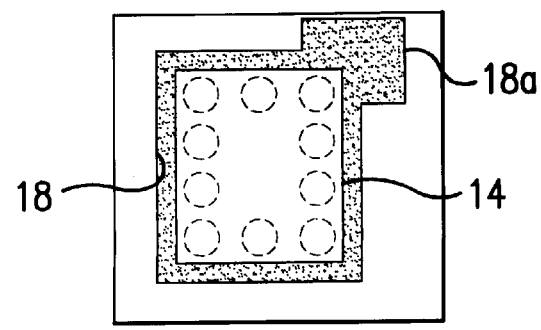
Figure 6F:
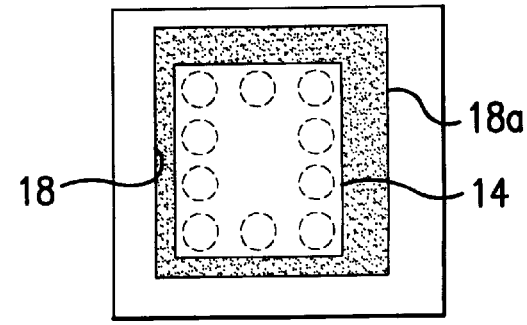

A part of the enclosure 18 protrudes outward (in the instant embodiment, in a corner thereof), as shown in FIG. 4. This protrusion functions as a gate 18a for casting a resin. It is preferable that the gate 18a has such a size that it can receive a complete drop of the resin 16 which is introduced onto the gate from a dispenser or like apparatus. Moreover, a groove 18b for checking the status of resin-introduction is formed on the opposite side of the gate 18a (e.g., the farthest position from the gate 18a). It is preferable that the groove 18b has such a size that an operator can check the sealing resin 16 flowing into the groove 18b. A variety of shapes as shown in FIGS. 6A through 6F are available for the gate 18a. As shown, the gate 18a need not have the rectangular shape shown in FIG. 4. For instance, FIG. 6A shows a gate 18a disposed along part of one side of the enclosure 18 (e.g., along a length over half of the length of the one side). FIG. 6B shows a gate disposed along at least the entire length of one side of the enclosure 18. FIG. 6C shows a gate 18a protruding in two-steps in a corner extending from the enclosure 18. FIG. 6D shows a gate 18a protruding outward and having a round head in a corner of the enclosure 18. FIG. 6E shows a gate 18a which is disposed in a corner and extends along part of two sides of the enclosure. FIG. 6F shows a gate 18a ranging along the overall length of two adjacent sides of the enclosure 18. The shape of the gate 18a is not restricted to the above examples shown in FIGS. 6A through 6F.

The gap defined by the enclosure 18 and present between the chip 14 and the circuit board 10 is filled with the sealing resin 16. A resin with insulating properties and having a low viscosity, for example, of up to 20 pa·s (for example, an epoxy resin) can be used for the resin 16 so that the resin can sufficiently flow into the gap between the chip 14 and the circuit board 10.

An example of a method of producing an electronic circuit device having the above-described structure will be described below.

First, the electrode 11 is formed in advance on the top of the printed circuit substrate 10 in a pattern. Photosensitive solder resist 12 is then coated onto the whole upper side of the pattern.

Then, the solder resist 12 is exposed by means of an aligner and dipped into a developer, so that only the portion of the solder resist 12 corresponding to the chip mounting area 13 (including the gate 18a and the groove 18b for monitoring resin-introducing) is removed. The resin is cured to form the solder resist film 12. In this manner, the enclosure 18 for preventing a resin from flowing out is formed.

Then, the chip 14 having the metallic bumps 15 made of Au or the like is mounted in a face-down orientation on the chip mounting area 13 with the bumps attached to the substrate 10 by a thermocompression technique or like technique. More particularly, in one exemplary embodiment, the bumps initially have a height of 20 to 50 μm. Then, the bumps 15 are crushed under pressure by thermocompression bonding so that the height is reduced to about 10 to 30 μm. The size of the bumps 15 defines the gap between chip 14 and the printed circuit substrate 10.

Thereafter, the sealing resin 16 is introduced through the gate 18a by means of the dispenser, so that the resin 16 flows into the gap between the chip 14 and the circuit board 10. The introduced resin 16 has a tear-drop shape which bulges at its bottom. In some cases, the resin may be spread at the position at which the resin drops. However, the gate 18a can receive an entire drop of the resin 16. Accordingly, the resin 16 received inside of the gate 18a is prevented from flowing out into an unintended location. The cast resin 16 having low viscosity or viscosity which is decreased by heating the board flows into the gap between the chip 14 and the circuit board 10 by means of the capillary phenomena. The flow of the resin 16 is slowest at the position at the gap opposite to the gate 18a. Accordingly, when resin 16 flows into the groove 18b, it can be inferred that the introduction of the resin 16 has been completed. Thus, it can be easily judged whether the introduction of resin has been completed or not.

The resin 16 after it is introduced is cured by heat curing or photo-curing.

By virtue of the ability of the enclosure 18 to retain resin without it flowing out, the resin 16 remains inside the enclosure even if the quantity of the deposited resin is increased to some degree. This compensates for variations in depositing a desired quantity of the resin from the dispenser.

Figure 7:
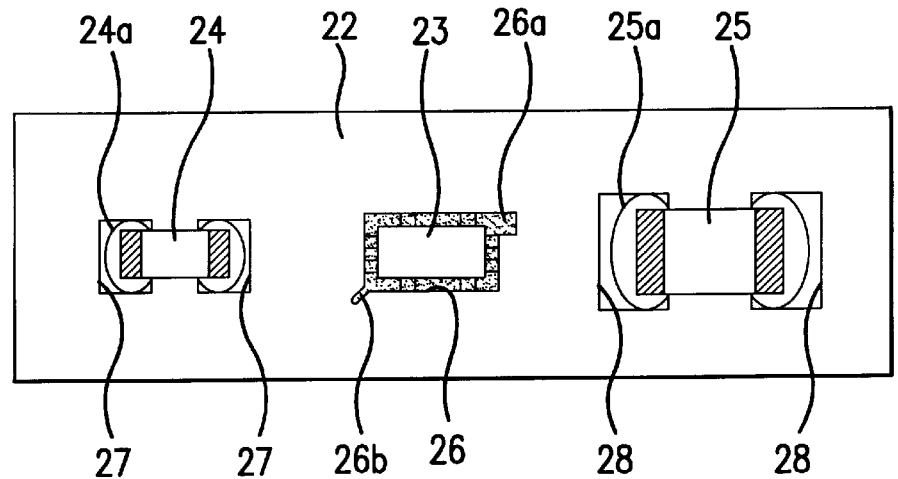
FIG. 7 is a plan view of a hybrid integrated circuit to which the present invention is applied.
Figure 8:
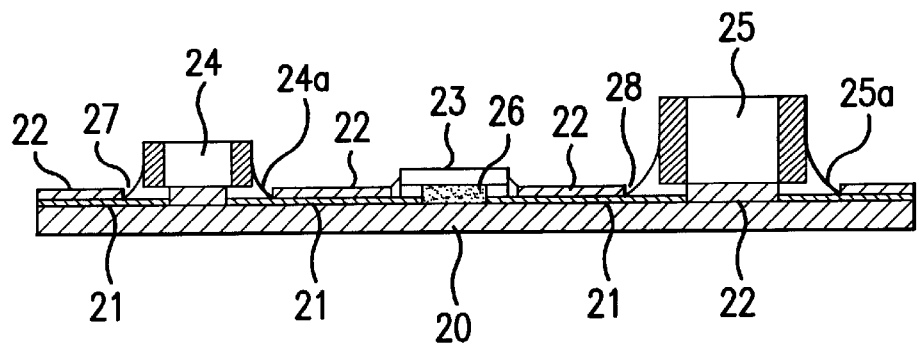
FIG. 8 is a sectional view of the hybrid integrated circuit of FIG. 7.

FIGS. 7 and 8 show an example of a hybrid integrated circuit to which the present invention can be applied.

In the figures, the hybrid integrated circuit device includes a circuit board 20, an electrode 21 formed on the circuit board 20 in a pattern, a solder resist film 22, a chip 23, and surface mounted components 24 and 25. Resist-free areas 26, 27, and 28 are formed at selected positions in the solder resist film 22, corresponding to a chip mounting area and the areas where the surface mounted components 24 and 25 are solder-bonded, respectively.

The resist-free area 26 of the solder resist film 22 corresponding to the chip mounting area forms an enclosure for retaining resin within the enclosure (e.g., for preventing the resin from flowing out). In a corner of the enclosure 26, a gate 26a for casting a resin is formed. In the corner of the enclosure 26 opposite to the gate 26a, a groove 26b for monitoring the resin introduction is formed. A sealing resin (not shown) is introduced into the gap between the chip 23 and the circuit board 20.

In the instant embodiment, the solder resist film 22 not only prevents the solders 24a and 25a for the surface mounted components 24 and 25 from flowing out, but also prevents a sealing resin for the chip 23 from flowing outside it intended boundaries. Thus, after the film is formed only one time, both of such functions can be achieved. That is, repeated film forming is not required.

Figure 9:
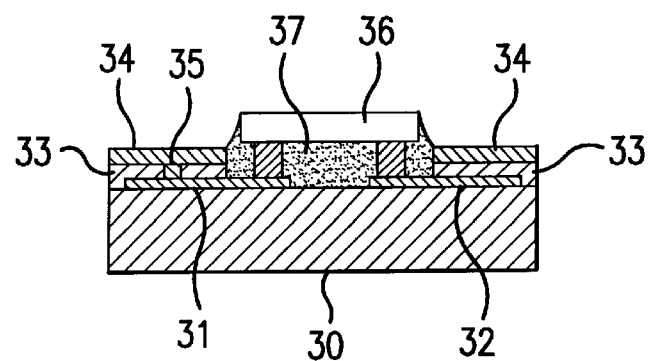
FIG. 9 is a sectional view of another embodiment according to the present invention.

In the above embodiments, the enclosures 18 and 26 are formed with an insulating resin such as a solder resist film. However, the enclosures may be formed with a metallic film, as shown in FIG. 9. In FIG. 9, an electronic circuit device includes a substrate 30, a ground electrode 31 having a coating thereon, an input-output electrode 32 having a coating thereon, an insulating film 33, such as a solder resist film, and a metallic film 34 formed on the insulating film 33. The metallic film 34 is formed in a thick film shape by a well-known method such as plating or a like technique and is in electric connection with the ground electrode 31 through a conducting portion 35.

The above metallic film 34 encloses the periphery of a chip 36 to prevent a sealing resin 37, introduced into the gap between the chip 36 and the board 30, from flowing outside its enclosure.

In the instant embodiment, the metallic film 34 not only functions as an enclosure for preventing a resin from flowing out but also achieves a shielding effect.

Moreover, according to an aspect of the present invention, the enclosure for retaining the resin may be made of glass or the like, in place of or in addition to a resin material and a metallic material.

The enclosure is not restricted to the film-shape formed as described in the above embodiments and may be formed in a dam or weir shape. That is, the enclosure can form essentially a wall which confines the resin.

The supply of the sealing resin can be carried out at the same time that the chip is mounted in a face-down orientation, and is not restricted to the supply after the chip is mounted in a face-down orientation. That is, a drop or drops of a sealing resin can be supplied in advance of the actual mounting operation in the center of the chip mounting area of the circuit board. The chip is mounted in face-down orientation thereon, whereby the resin is introduced into the gap between the chip and the circuit board. Then, the resin is cured by heating or like technique for sealing.

As seen in the above description, according to an aspect of the present invention, the enclosure for confining the resin and having a larger size than the chip is provided in the chip mounting area of the circuit board. The chip is mounted in a face-down orientation in the chip mounting area, and the sealing resin is introduced into the gap between the chip and the printed circuit board. Accordingly, the enclosure prevents the resin from spreading unnecessarily and covering the electrode of a surface mounting component adjacent to the chip. Thus, the electronic circuit device having surface mounted components exhibiting a high mounting density is attainable.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What as claimed is:

1. An electronic circuit device, comprising:
   a circuit board;
   a chip mounted in a face-down orientation on a chip mounting area of said circuit board;
   an enclosure sized large enough to enclose said chip within said enclosure;
   a resin confined to an interior region of said enclosure, and formed between said chip and said circuit board; and wherein said enclosure includes a gate for receiving said resin.

2. An electronic circuit device of claim 1, wherein a gap is provided which separates at least one side of said chip from an adjacent side of said enclosure.

3. An electronic circuit device of claim 2, wherein said gap is in the range of about 200 μm to 300 μm.

4. An electronic circuit device of claim 1, wherein a distance between an upper surface of said chip and said board is greater than a distance between an upper surface of said enclosure and said board.

5. An electronic circuit device of claim 1, wherein said chip comprises a conductive bump, and said circuit board comprises an electrode, wherein said conductive bump contacts said electrode.

6. An electronic circuit device of claim 1, wherein said circuit board includes a layer of material formed thereon, and said enclosure is formed by a recess formed in said layer of material by the removal of said layer of material.

7. An electronic circuit device according to claim 6, wherein said material is a photosensitive solder resist.

8. An electronic circuit device according to claim 7, further including a metallic layer formed over said resist layer.

9. An electronic circuit device according to claim 1, wherein said gate comprises an extended portion in a perimeter of said enclosure.

10. An electronic circuit device according to claim 9, wherein said enclosure is rectangular shaped, and said extended portion is formed in at least one side of said rectangular shaped enclosure.

11. An electronic circuit device according to claim 9, wherein said enclosure is rectangular shaped, and said extended portion is formed in two sides of said rectangular shaped enclosure.

12. An electronic circuit device according to claim 9, wherein said enclosure is rectangular shaped, and said extended portion comprises a first protrusion located in one corner of said rectangular shape.

13. An electronic circuit device according to claim 1, wherein said enclosure includes a protrusion for use in checking the status of a resin filling operation.

14. An electronic circuit device according to claim 13, wherein said protrusion comprises a groove.

15. An electronic circuit device according to claim 12, wherein said enclosure includes a second protrusion for use in checking the status of a resin filling operation.

16. An electronic circuit device according to claim 15, wherein said second protrusion is located at an opposite corner than said first protrusion.

17. An electronic circuit device according to claim 1, wherein said enclosure includes a gate for receiving said resin and an oppositely disposed groove for monitoring the status of a resin filling operation.

18. An electronic circuit board according to claim 1, wherein said enclosure is formed with a solder resist film.

19. An electronic circuit board according to claim 1, wherein said enclosure is formed with a photosensitive resin material by photolithography.

* * * * *